United States Patent
Akimoto

(10) Patent No.: US 9,787,330 B2
(45) Date of Patent: Oct. 10, 2017

(54) CONTROLLER HAVING ERROR CORRECTION FUNCTION IN ACCORDANCE WITH OPERATING STATE OF MONITORING TARGET

(71) Applicant: FANUC Corporation, Minamitsuru-gun, Yamanashi (JP)

(72) Inventor: Shinji Akimoto, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 0 days.

(21) Appl. No.: 14/733,985

(22) Filed: Jun. 9, 2015

(65) Prior Publication Data

US 2015/0365110 A1    Dec. 17, 2015

(30) Foreign Application Priority Data

Jun. 11, 2014   (JP) ................................. 2014-120397

(51) Int. Cl.
  *G06F 11/07*   (2006.01)
  *G06F 11/10*   (2006.01)
  *H03M 13/35*   (2006.01)

(52) U.S. Cl.
  CPC ......... *H03M 13/353* (2013.01); *G06F 11/076* (2013.01); *G06F 11/1048* (2013.01); *G06F 11/1068* (2013.01); *G06F 11/0751* (2013.01); *G06F 2201/81* (2013.01)

(58) Field of Classification Search
  CPC ............. G06F 11/1068; G06F 11/1048; G06F 11/076; G06F 16/349; G06F 16/3495; G06F 29/52; G06F 2201/81; G06F 11/0751

USPC ........................................................ 714/763
See application file for complete search history.

(56) References Cited

U.S. PATENT DOCUMENTS

| | | | | |
|---|---|---|---|---|
| 8,122,323 | B2* | 2/2012 | Leung | G06F 11/1068 714/720 |
| 8,966,347 | B2* | 2/2015 | Dave | G06F 11/1068 714/774 |
| 8,990,644 | B2* | 3/2015 | Seabury | G06F 11/1048 714/704 |
| 2008/0222490 | A1 | 9/2008 | Leung et al. | |

(Continued)

FOREIGN PATENT DOCUMENTS

| | | |
|---|---|---|
| JP | 2004-140726 A | 5/2004 |
| JP | 2010-074365 A | 4/2010 |

(Continued)

OTHER PUBLICATIONS

Notification of Reasons for Refusal issued Nov. 22, 2016 in Japanese Patent Application No. 2014-120397 (2 pages) with an English Translation (2 pages).

*Primary Examiner* — James C Kerveros
(74) *Attorney, Agent, or Firm* — Drinker Biddle & Reath LLP

(57) ABSTRACT

A controller has an error correction capability by including: a state monitoring unit that analyzes a state of a monitoring target and outputs state information; an error correction processing unit that switches error correction codes so that a correction rate for the respective states becomes a value within a predetermined range; and a correction rate calculation unit that calculates the correction rate for the respective states based on the correction result by the error correction processing unit.

11 Claims, 5 Drawing Sheets

(56) References Cited

U.S. PATENT DOCUMENTS

| | | | | |
|---|---|---|---|---|
| 2010/0192041 A1* | 7/2010 | Jeddeloh | ............ | G11C 29/4401 |
| | | | | 714/763 |
| 2010/0332923 A1* | 12/2010 | D'Abreu | ............. | G06F 11/1068 |
| | | | | 714/708 |
| 2013/0318418 A1* | 11/2013 | Bedeschi | ............ | G06F 11/1048 |
| | | | | 714/758 |
| 2014/0059406 A1* | 2/2014 | Hyun | .................. | G11C 11/5621 |
| | | | | 714/773 |
| 2014/0164867 A1* | 6/2014 | Kaynak | ................... | G06F 11/10 |
| | | | | 714/763 |
| 2015/0089332 A1* | 3/2015 | Chambers | ......... | H03M 13/6306 |
| | | | | 714/807 |
| 2015/0106667 A1* | 4/2015 | Zeng | .................. | G11C 16/3409 |
| | | | | 714/704 |

FOREIGN PATENT DOCUMENTS

| | | |
|---|---|---|
| JP | 2012-155737 A | 8/2012 |
| WO | WO-2013-190671 A1 | 12/2013 |

\* cited by examiner

FIG. 4

| NUMBER OF TIMES OF DECODING (COUNT) | 1 | 2 | 3 | 4 | 5 | 6 | 7 | 8 | 9 | 10 |
|---|---|---|---|---|---|---|---|---|---|---|
| NUMBER OF CORRECTED BITS E | 0 | 0 | 1 | 0 | 2 | 0 | 1 | 0 | 0 | 2 |

IN THE CASE OF T = 3, J = 4

$$\frac{1}{P_1} = 4 \times 2^{(3-1)} \times 3 = 48$$

$$\frac{1}{P_2} = 4 \times 2^{(3-2)} \times 2 = 16$$

$$\frac{1}{P_3} = 4 \times 2^{(3-1)} \times 2 = 32$$

$$\frac{1}{P_4} = 4 \times 2^{(3-2)} \times 3 = 24$$

$$P = \frac{1}{48} + \frac{1}{16} + \frac{1}{32} + \frac{1}{24} = \frac{5}{32}$$

FIG. 5

| NUMBER OF TIMES OF DECODING (COUNT) | 1 | 2 | 3 | 4 | 5 | 6 | 7 | 8 | 9 | 10 |
|---|---|---|---|---|---|---|---|---|---|---|
| NUMBER OF CORRECTED BITS E | 0 | 0 | 1 | 0 | 2 | 0 | 1 | 0 | 0 | 2 |

IN THE CASE OF T = 3, J = 4

$$P = \left(\frac{1}{3\times 3} + \frac{2}{2\times 3} + \frac{1}{2\times 3} + \frac{2}{3\times 3}\right)/4$$

$$= \frac{5}{24}$$

FIG. 6

| NUMBER OF TIMES OF DECODING (COUNT) | STATE INFORMATION | NUMBER OF CORRECTED BITS E |
|---|---|---|
| 1 | LOW TEMPERATURE | 0 |
| 2 | LOW TEMPERATURE | 0 |
| 3 | NORMAL TEMPERATURE | 0 |
| 4 | HIGH TEMPERATURE | 0 |
| 5 | HIGH TEMPERATURE | 1 |
| 6 | HIGH TEMPERATURE | 0 |
| 7 | HIGH TEMPERATURE | 0 |
| 8 | HIGH TEMPERATURE | 2 |
| 9 | HIGH TEMPERATURE | 0 |

EXTRACT ONLY CORRECTION INFORMATION OF WHICH STATE INFORMATION IS HIGH TEMPERATURE

CORRECTION HISTORY ONLY WHEN STATE IS HIGH TEMPERATURE

| NUMBER OF TIMES OF DECODING WHEN STATE IS HIGH TEMPERATURE (COUNT) | 1 | 2 | 3 | 4 | 5 | 6 |
|---|---|---|---|---|---|---|
| NUMBER OF CORRECTED BITS Es WHEN STATE IS HIGH TEMPERATURE | 1 | 0 | 2 | 0 | 1 | 0 |

CONTROLLER HAVING ERROR CORRECTION FUNCTION IN ACCORDANCE WITH OPERATING STATE OF MONITORING TARGET

RELATED APPLICATION DATA

This application claims priority under 35 U.S.C. §119 and/or §365 to Japanese Application No. 2014-120397 filed Jun. 11, 2014, the entire contents is incorporated herein by reference.

BACKGROUND OF THE INVENTION

1. Field of the Invention

The present invention relates to a controller that has an error correction function, used for memory and communication, to improve reliability of an apparatus/system by automatically correcting errors, and more particularly to a controller having an error correction function used in an industrial apparatus or a system which must operate correctly in a poor working environment caused by temperature, vibration, noise or the like, or an apparatus/system, for which reliability is demanded, as represented by medical, aerospace and public systems.

2. Description of the Related Art

There is an error correction method that automatically corrects an error using error correction codes, in order to improve reliability of data. Error correction codes have been researched in coding theory, and various configurations of correction codes having different functions have been proposed, such as correction codes especially for burst errors, and correction codes having locally intensified error correction capabilities. Normally one error correction code having sufficient correction capability is designed for an assumed error. In machines, particularly in machine tools, however, time-dependent errors are generated due to causes related to the installation environment and operating state, and correction capability becomes insufficient or resources are wasted if only one error code is used.

To solve this problem, a memory to switch between different error correction codes having different encoding efficiency values, based on an error rate determined from errors detected with each error correction code, has been proposed (e.g. see Japanese Patent Application Laid-Open No. 2012-155737).

With the error correction method according to the prior art, however, correction capability is switched based only on the error rate, hence it is impossible to switch to a correction capability that is appropriate for an error depending on the state of the machine. Further, the error rate is calculated based on the detection of uncorrectable errors, hence machine shutdown due to an uncorrectable error cannot be prevented.

SUMMARY OF THE INVENTION

With the foregoing in view, it is an object of the present invention to provide an error correction method to solve issues related to insufficient correction capabilities and a waste of resources by appropriately switching the error correction capability when time-dependent errors are generated due to causes related to the installation environment and operation state.

A controller according to the present invention has an error correction function that encodes information data into code words and decodes code words into information data by using error correction codes, and automatically corrects a correctable error in decoding. This controller has: a state monitoring unit that monitors a state of a monitoring target and outputs state information; a correction rate calculation unit that outputs a correction rate for respective states; and an error correction processing unit that has an error correction code group including a plurality of error correction codes having a correction capability ranking, which is defined according to a predetermined standard, encodes information data into code words and decodes code words into information data by switching the error correction codes, and outputs correction information related to the error correction. The correction rate calculation unit is constituted to calculate the correction rate for the respective states based on the state information outputted by the state monitoring unit and the correction information outputted by the error correction processing unit, and the error correction processing unit is constructed to switch to the error correction codes based on the correction code for the respective states outputted by the correction rate calculation unit.

The controller may further include a sequential arithmetic circuit, and the correction rate calculation unit may be constructed to calculate the correction rate for the respective states, using the sequential arithmetic circuit.

The correction rate calculation unit may include a correction information history table that stores the state information and the correction information after linking these items of information, and may be constructed to calculate the correction rate for the respective states, based on the state information outputted by the state monitoring unit, the correction information outputted by the error correction processing unit, and the correction information history table.

The error correction processing unit may be constituted so that code words based on one error correction code of the error correction code group can be re-encoded into code words based on another error correction code of the error correction code group.

The error correction code group may include error correction codes of which correction capability is quantified based on the number of random error-correctable bits.

The error correction code group may include error correction codes of which correction capability is quantified based on the number of burst error-correctable bits.

The error correction code group may include error correction codes of which correction capability is quantified based on an encoding rate.

The state monitoring unit may include: a state information generation unit that monitors a measurement value by a sensor installed in a monitoring target, determines whether the measurement value is within a predetermined range or not, and generates state information based on the determined result; and a range change unit that changes the predetermined range.

The state monitoring unit may include: a state information generation unit that monitors a program counter of a controller of a machine which executes a control program, determines whether a value of the program counter is within a predetermined program block or not, and generates state information based on the determined result; and a definition change unit that changes the definition of the predetermined program block.

The controller may include an error correction code registration/change unit that registers or changes an error correction code in the error correction code group.

The correction rate calculation unit may be constructed to calculate the correction rate for the respective states based on the number of corrected bits in a predetermined period for the respective state.

The present invention can provide a controller having an error correction function to solve the insufficient correction capabilities and waste of resources by appropriately switching error correction capability based on the correction rate for the respective states, when time-dependent errors are generated due to causes related to the installation environment and operation state.

Furthermore, an error correction code is changed to one having a sufficient correction capability in accordance with the correction rate for the respective states, whereby the correction capability can be improved before an uncorrectable error is generated and a frequency of occurrence of a system shutdown, due to an uncorrectable error, can be reduced.

BRIEF DESCRIPTION OF THE DRAWINGS

The forgoing and other objects and feature of the invention will be apparent from the following description of preferred embodiments of the invention with reference to the accompanying drawings, in which:

FIG. 4 is a diagram depicting an example of calculating the correction rate based on the sequential operation, executed by the correction rate calculation unit of the controller in FIG. 1;

FIG. 5 is a diagram depicting an example of calculating the correction rate using the correction history table;

FIG. 6 is a diagram depicting the correction information history table;

DESCRIPTION OF THE PREFERRED EMBODIMENTS

Figure 1:
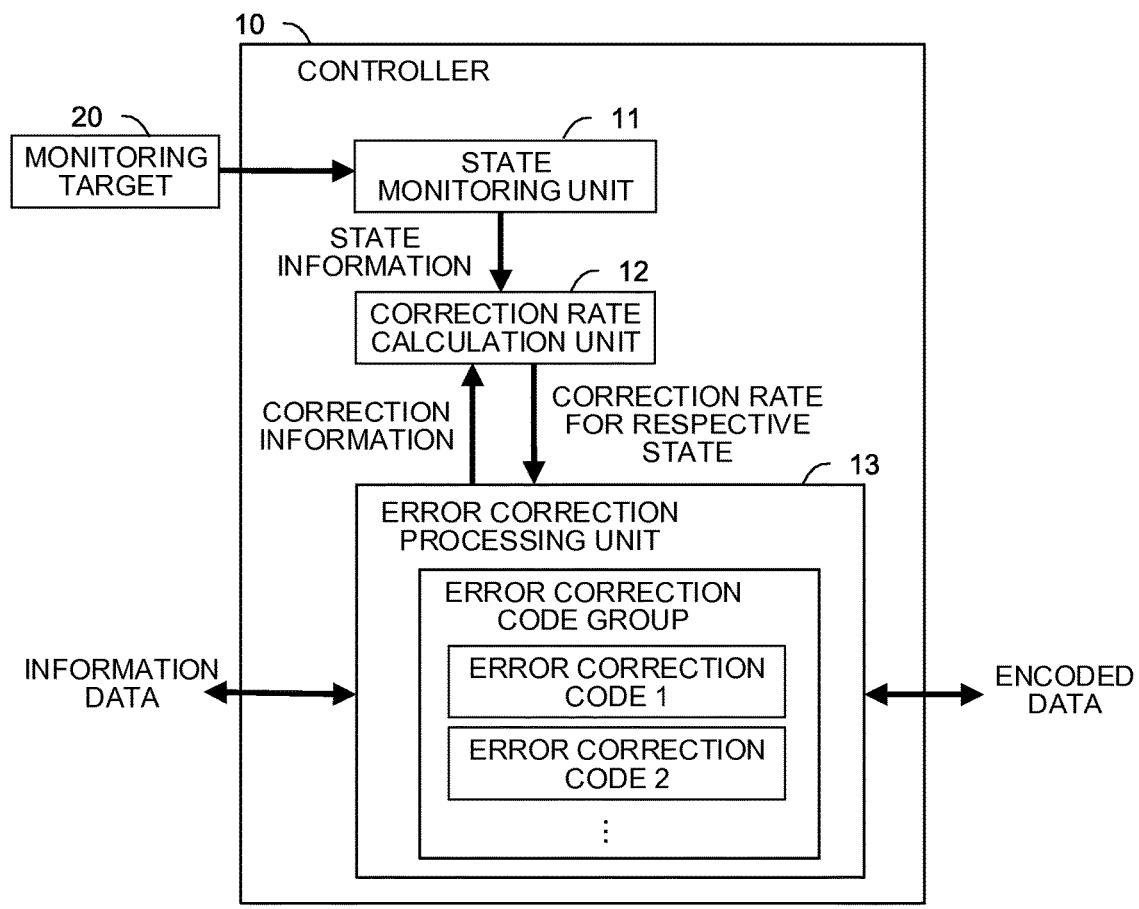
FIG. 1 is a functional block diagram depicting an embodiment of the controller having an error correction function according to the present invention.

An embodiment of the controller having the error correction function according to the present invention will be described first, with reference to the functional block diagram in FIG. 1.

The controller 10 has a state monitoring unit 11 that monitors the state of a monitoring target 20, a correction rate calculation unit 12 that calculates the correction rate for respective states, and an error correction processing unit 13 that executes encoding processing for information data and decoding processing for encoded data.

Functions and operations of each component constituting the controller 10 will be described next.

Figure 2:
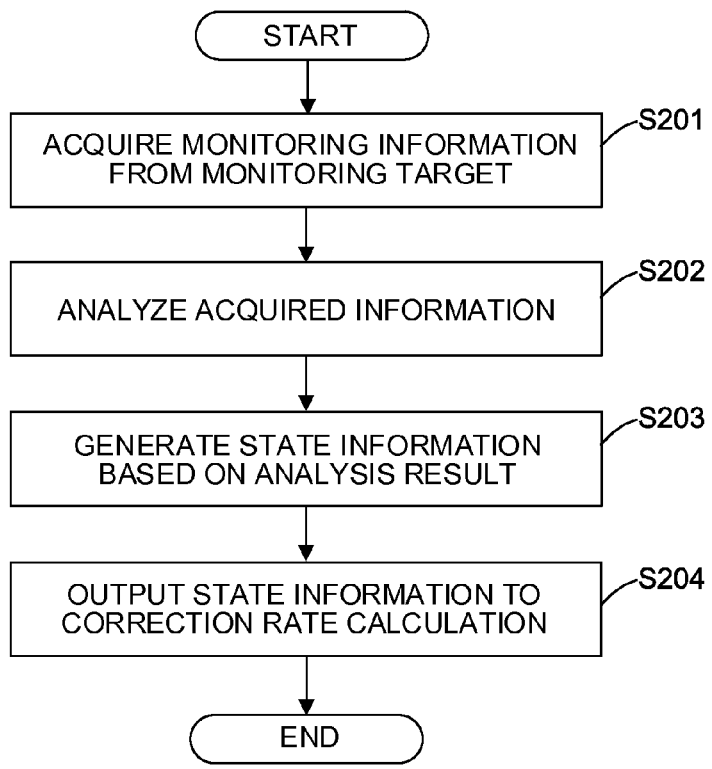
FIG. 2 is a flow chart depicting an operation of the state monitoring unit of the controller in FIG. 1.

The operation of the state monitoring unit 11 of the controller 10 in FIG. 1 will be described with reference to the flow chart in FIG. 2.

The state monitoring unit 11 acquires information on a monitoring target 20 (step S201), and analyzes the state of the monitoring target 20 based on the acquired information (step S202). Then the state monitoring unit 11 generates state information based on the analyzed state of the monitoring target 20 (step S203), and outputs the generated state information to the correction rate calculation unit 12 (step S204).

The monitoring target 20 may be a machine tool in which the controller 10 is integrated, and in this case, the information to analyze the state of the monitoring target 20 may be, for example, temperature information acquired from the temperature sensor installed in the machine tool. If the temperature information is used, the state monitoring unit 11 analyzes which temperature range (defined based on the temperature threshold) the temperature acquired from the temperature sensor installed in the monitoring target 20 belongs to, generates the state of high temperature, normal temperature, low temperature or the like as the state information, and outputs the generated state information to the correction rate calculation unit 12.

The monitoring target 20 may be a processor that executes a control program, for example, and the information to analyze the state of the monitoring target 20 in this case may be a value of a program counter installed in the processor. In this case, the state monitoring unit 11 analyzes which program block is being executed based on the value of the program counter acquired from the monitoring target, generates a name of the program block as the state information, and outputs the generated state information to the correction rate calculation unit 12.

For the information that is used for analyzing the state of the monitoring target 20, such as a threshold of the temperature range and a definition of the program block, predetermined information may be used, or means of externally setting the information used for analysis may be integrated into the controller. By this configuration, a change of the installation location of the monitoring target 20 or the like can be handled by changing the setting.

The monitoring target 20 may also be an industrial apparatus/system, or an apparatus/system for which reliability is demanded, including medical, aerospace and public systems. For the information used for analyzing the state of the monitoring target 20, various information that influences the apparatus or system, such as vibration, noise and radiation dosage, may be used.

Figure 3:
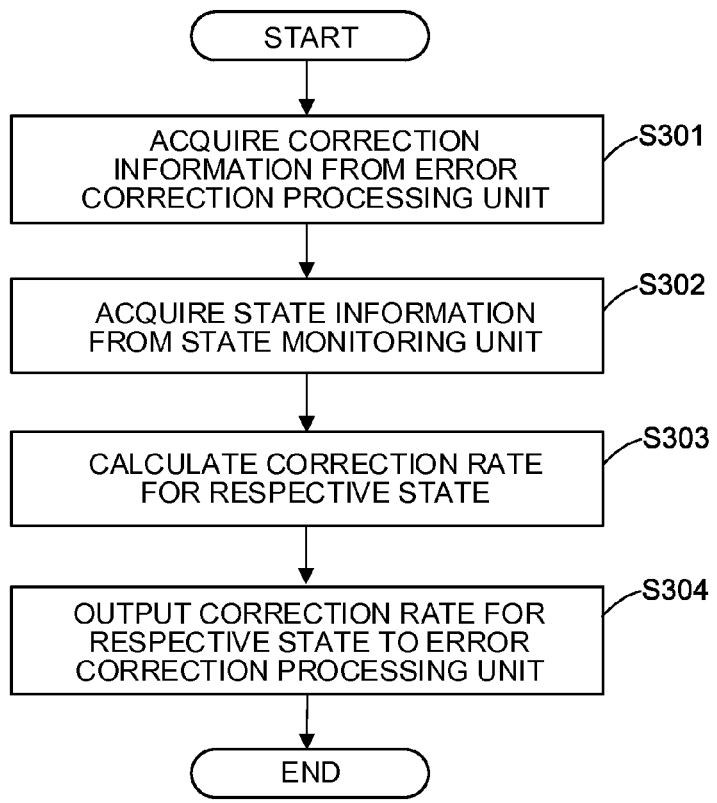
FIG. 3 is a flow chart depicting an operation of the correction rate calculation unit of the controller in FIG. 1.

The operation of the correction rate calculation unit 12 of the controller 10 in FIG. 1 will be described next with reference to the flow chart in FIG. 3.

When the correction rate calculation unit 12 acquires the correction information from the error correction processing unit 13 (step S301), the correction rate calculation unit 12 acquires the state information from the state monitoring unit (step S302), and calculates the correction rate for the respective states based on the acquired state information and the correction information acquired from the error correction processing unit 13 (step S303), and outputs the calculated correction rate for the respective states to the error correction processing unit 13 (step S304).

The correction rate will now be described.

Normally an error correction code has a correction capability where the number of correctable bits is T bits, and when K bits of information data are converted into N bits of code words in encoding, errors of the code words are detected and corrected in decoding so as to restore the information data, and if errors amount to or exceed T bits, a result to notify that correction is impossible is outputted. The parameters of correction capability of the error correction codes are, for example, the number of burst error correctable bits when a burst error occurs, the number of random error correctable bits when a random error occurs, or an encoding rate given by N/K.

In this embodiment, a correction rate, that is a parameter to indicate the latest error generation state, and that is different from the above mentioned parameters, is used. The correction rate is defined as a parameter to indicate the latest error generation state at a certain time point using the number of corrected bits which were corrected by the error correction code.

An example of the definition of the correction rate in the case of a sequential arithmetic circuit will be described. When the number of error correctable bits of an error correction code is T bits, the correction rate P, at a point when correction has been performed J times (predetermined number of times), is defined by the following Expression (1), using the number of code words $C_i$ decoded by the respective correction (i=1, 2, . . . J) and the respective number of corrected bits $E_i$ (i=1, 2, . . . J).

$$P = \sum P_i \quad (1)$$

$$\frac{1}{P_i} = J \times 2^{T-E_i} \times C_i$$

$$(J = 2^k, \text{ where } k \text{ is an integer})$$

Here $P_i$ is a correction rate regarding the correction at the time point when the error correction is generated, and the correction rate P is determined as a sum of $P_i$ for J number of times. If the correction rate is defined as Expression (1), an arithmetic circuit that sequentially calculates the correction rate using a counter, a bit shift circuit or the like, can easily be constructed. In this case, previously calculated values can be used for $P_1$ to $P_{J-1}$.

An example of calculating the correction rate using the correction rate calculation unit 12 based on sequential operation will be described with reference to FIG. 4.

The table in FIG. 4 shows the number of corrected bits in each decoding processing of code words executed by the controller. If the number of corrected bits is 0, this means that no correction was necessary, although decoding processing was executed for the coded words. In this example, the correction rate is calculated at a stage when decoding processing was executed ten times. It is assumed that the correction rate is calculated using correction information obtained in recent four-time decoding processing, where the number of error-correctable bits T is 3.

According to the table in FIG. 4, 1 bit was corrected in the third decoding processing, 2 bits were corrected in the fifth decoding, 1 bit was corrected in the seventh decoding, and 2 bits were corrected in the tenth decoding. If the correction rate is calculated using Expression (1) based on the table in FIG. 4, the number of coded words that have been decoded by the respective correction is $C_1=3$, $C_2=5-3=2$, $C_3=7-5=2$ and $C_4=10-7=3$, and the number of corrected bits is $E_1=1$, $E_2=2$, $E_3=1$ and $E_4=2$ respectively, and the correction rate is $5/32≅0.16$, as shown in the expressions in FIG. 4.

In this embodiment, the above mentioned correction rate is calculated for each state that is possible according to the state information. In other words, if n number of states s (s∈S, S={$s_1$ . . . $s_n$}) are possible according to the state information, and an error correction code, of which number of error-correctable bits is $T_s$, are used, then the correction rate $P_s$ is defined as follows at the time point when the correction is executed the $J_s$-th time (the predetermined number of times), $$P_s = \sum P_s \quad (2)$$

$$\frac{1}{P_{si}} = J_s \times 2^{T_s-E_{si}} \times C_{si}$$

$$(J_s = 2^k, \text{ where } k \text{ is an integer})$$

where $C_{si}$ (si=1 . . . $J_s$) denotes the number of coded words which have been decoded by the respective correction, and $E_{si}$ (si=1 . . . $J_s$) denotes the number of corrected bits of the corrected code words.

To calculate the correction rate for the respective states, the correction rate calculation unit 12 may have an arithmetic circuit for the respective states.

Another example of defining the correction rate is shown, where the error correction history is recorded and used. If an error correction code, of which number of correctable bits is T, is used, the correction rate P is defined as the following Expression (3), at the time point when the correction is executed the J-th time (predetermined number of times), $$P = \frac{\sum \frac{E_i}{C_i \times T}}{J} \quad (3)$$

where $C_i$ (i=1, 2, . . . J) denotes the number of coded words that have been decoded by the respective correction, and $E_i$ (i=1, 2, . . . J) denotes the number of corrected bits in each case.

For J, which denotes a predetermined number of times, information that is defined in advance may be used, or means of externally setting J may be integrated into the controller. By this configuration, a change in the installation location of the monitoring target 20 or the like can be handled by changing the settings.

FIG. 5 shows an example of calculating the correction rate in the case where the correction rate is defined like this.

The table in FIG. 5 shows a correction history table in which the number of corrected bits in each decoding processing of coded words executed by the controller is recorded as the correction history. If the number of corrected bits is 0, this means that no correction was necessary, although the decoding process was executed for the coded words. In this example, the correction rate is calculated at the stage when the decoding processing was executed ten times based on this correction history. It is assumed that the correction rate is calculated using correction information obtained in recent four-time decoding processing, where the number of error-correctable bits T is 3.

According to the table in FIG. 5, 1 bit was corrected in the third decoding processing, 2 bits were corrected in the fifth decoding processing, 1 bit was corrected in the seventh decoding processing, and 2 bits were corrected in the tenth decoding processing. If the correction rate is calculated using Expression (1) based on the table in FIG. 5, the number of decoded code words that have been decoded by the respective correction is $C_1=3$, $C_2=5-3=2$, $C_3=7-5=2$ and $C_4=10-7=3$, and the number of corrected bits is $E_1=1$, $E_2=2$, $E_3=1$ and $E_4=2$ respectively, and the correction rate is $5/24≅0.21$, as shown in the expressions in FIG. 5.

In this embodiment, the above mentioned correction rate is calculated for each state that is possible according to the state information. In other words, if n number of states s (s∈S, S={$s_1$ . . . $s_n$}) are possible according to the state information, and error correction codes, of which number of correctable bits is $T_s$, are used, then the correction rate $P_s$ is defined as in the following Expression (4) at the point when the correction is executed the $J_s$-th time, $$P_s = \frac{\sum \frac{E_{si}}{C_{si} \times T_s}}{J_s} \quad (4)$$

where $C_{si}$ (si=1 ... $J_s$) denotes the number of coded words which have been decoded by the respective correction, and $E_{si}$ (si=1 ... $J_s$) denotes the number of corrected bits of the corrected code words.

To calculate the correction rate for the respective states, the correction rate calculation unit 12 links the state information acquired from the state monitoring unit 11 and the correction information acquired from the error correction processing unit 13, and stores and manages this information as the correction history in the correction information history table, and when the correction rate is calculated for the respective states, the correction rate calculation unit 12 calculates the correction rate for the respective states by extracting the correction history linked to the specified state, from the correction information history table.

For example, in the case where information that can be acquired according to the state information is high temperature, normal temperature, and low temperature, if the correction rate calculation unit 12 acquires correction information from the error correction processing unit 13, the correction rate calculation unit 12 acquires, from the state monitoring unit 11, the state information (high temperature, normal temperature, low temperature) of the monitoring target 20 at the time point when the correction information was acquired, and stores the state information in the correction information history table. In this case, the correction history is stored in the correction information history table, as shown in FIG. 6. To calculate the correction rate in the case where the state information indicates the high temperature state in the correction information history table shown in FIG. 6, the correction history, in which the high temperature state is recorded in the state information, is extracted from the correction information history table, and the extracted correction history is applied to the above mentioned expression, so as to calculate the correction rate.

Figure 7:
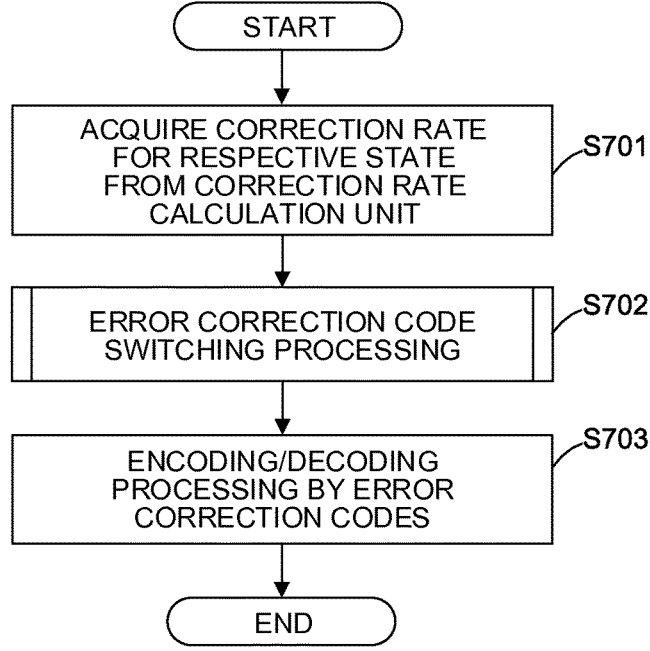
FIG. 7 is a flow chart depicting the operation of the error correction processing unit of the controller in FIG. 1.

FIG. 7 is a flow chart depicting the operation of the error correction processing unit 13 according to this embodiment.

The error correction processing unit 13 acquires the correction rate for the respective states from the correction rate calculation unit 12 (step S701), selects a most appropriate error correction code out of the error correction code group based on the acquired correction rate for the respective states, and switches to this error correction code (step S702). Then the error correction processing unit 13 executes encoding processing from the information data to the code words and decoding processing from the coded words to the information data, based on the error correction code that is switched to in step S702 (step S703).

When the decoding processing of the coded words is executed, the error correction processing unit 13 outputs the correction information based on the result of the decoding processing. In the decoding processing of the coded words, the correction information includes information of the number of bits corrected by the correction processing, if such correction processing was performed on the coded words.

The outputted correction information is used for the correction rate calculation unit 12 to calculate the correction rate for the respective states.

The error correction processing unit 13 has an error correction code group, including a plurality of mutually different error correction codes ranked by correction capability determined according to a predetermined standard. The error correction codes include programs to encode the information data into coded words, and decode the coded words into information data, and the set values required for operating the program. Each error correction code is managed together with a parameter that indicates the correction capability of this error correction code, and if the error correction code is switched, this parameter is referred to, whereby the error correction code is switched to one having a more appropriate correction capability in accordance with the state of the monitoring target 20. The parameter that indicates the correction capability of the error correction code may be quantified based on the number of random error correctable bits, the number of burst error correctable bits, or an encoding rate, for example. The error correction code may be a BCH code or a Reed-Solomon code, or another error correction code may be used.

For the error correction codes of the error correction code group, pre-programmed codes stored in the apparatus may be used, or means of externally setting the error correction codes may be integrated into the controller, such as updating the error correction codes via a network. By this configuration, a change in the installation location of the monitoring target 20 or the like can be handled by changing the setting.

When the error correction processing unit 13 acquires the correction rate for the respective states from the correction rate calculation unit 12, the error correction processing unit 13 refers to a parameter of the error correction code based on the acquired value of the correction rate for the respective states, and switches to a more appropriate error correction code.

Figure 8:
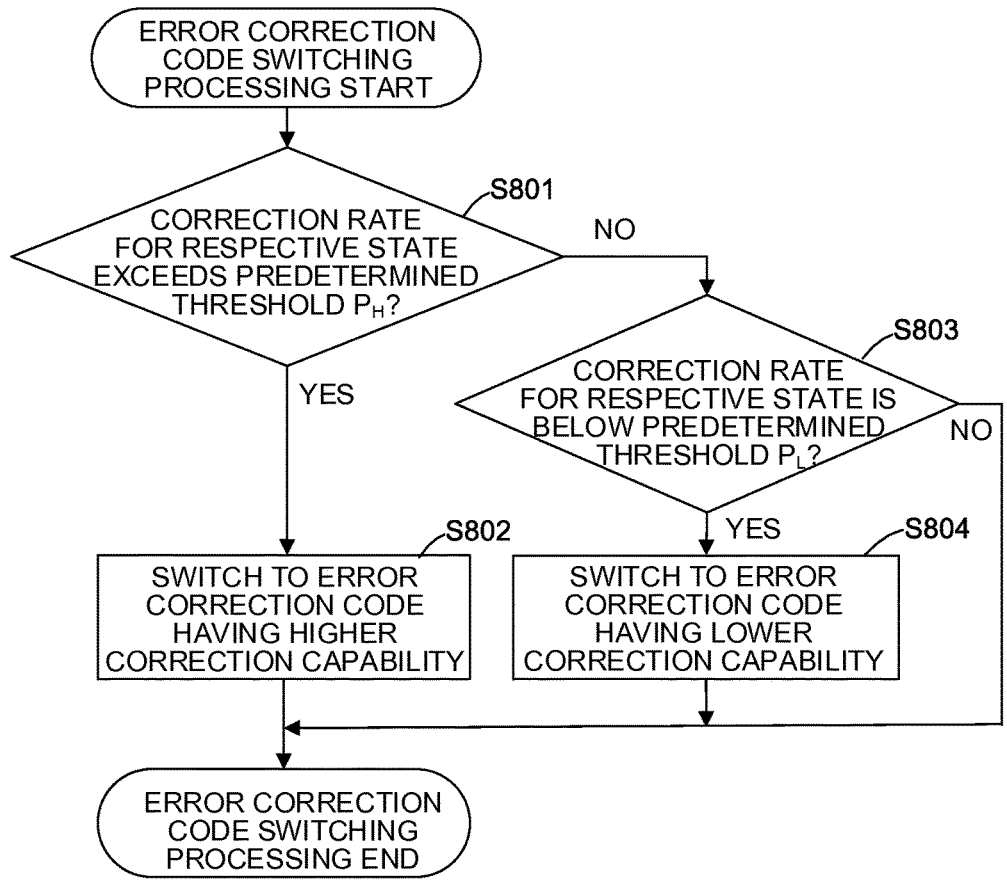
FIG. 8 is a flow chart depicting an example of the error correction code switching processing that is executed by the error correction processing unit of the controller in FIG. 1.

An example of the error correction code switching processing according to this embodiment will be described with reference to the flow chart in FIG. 8.

The error correction processing unit 13 compares the correction rate for the respective states, which was acquired from the correction rate calculation unit 12, with a predetermined threshold $P_H$ which is set in advance (step S801), and if the correction rate for the respective states exceeds the predetermined threshold $P_H$, the error correction processing unit 13 refers to the parameters of the error correction code, and switches the error correction code to a code that has a higher correction capability (step S802). If the correction rate for the respective states does not exceed the predetermined threshold $P_H$, on the other hand, the error correction processing unit 13 compares the correction rate for the respective states with the predetermined threshold $P_L$ that is set (step S803), and if the correction rate for the respective states is below the predetermined threshold $P_L$, the error correction processing unit 13 refers to the parameter of the error correction code, and switches the error correction code to a code that has a lower correction capability (step S804).

As shown in Expression (2), an increase in the correction rate for the respective states means that the value of the number of code words that were decoded by correction ($C_{si}$) became smaller (increase of error frequency), or the value of the number of corrected bits of the corrected code words ($E_{si}$) became greater (increase of number of error bits). The generation of such a state means that the operation environment of the monitoring target 20 has become more severe, hence generation of uncorrectable errors, which causes system shutdown, can be prevented by switching the error correction code to a code that has a higher correction capability in advance. A decrease in the correction rate for the respective states, on the other hand, means that the error rate of the code words dropped, hence excessive use of a resource for error correction can be suppressed by switching the error correction code to a code that has a lower correction capability.

The threshold of the correction rate for the respective states for switching the error correction codes may be appropriately changed externally. Providing such means allows adjusting the timing of switching the error correction code depending on the situation after installation in the operation environment.

For the ranking of the correction capability in the error correction code group as well, means of externally overwriting the ranking may be provided. Providing such means allows making adjustments so that a more appropriate error correction code may be selected depending on the situation after installation in the operation environment.

Furthermore, in order to handle the switching of error correction codes, the error correction processing unit 13 may include a function to re-encode the code words, which were encoded using the error correction code before the switching, to the error correction code after the switching.

The controller having this error correction capability can be applied to error correction of data on a memory used in a machine tool or the controller, when the machine tool is used as the monitoring target 20 and the temperature information is used as the state information, for example, as mentioned above. In this case, the error correction codes can be switched to handle a worsening operating environment due to an increase in temperature.

The controller having the error correction capability can be applied to an error correction of a control program written in ROM with an error correction function, when a processor which executes a control program is used as the monitoring target 20, and when the controller of the machine uses a program block name in execution as the state information, for example, as mentioned above. In this case, re-encoding is possible by switching error correction codes in accordance with the correction rate for each program block while the control program is being executed repeatedly.

The controller of this embodiment may be used not only for error correction in memory, but also for data handled in communication.

The embodiment of the present invention has been described as a controller having error correction capability, but the series of processing steps described above can also be provided as a program or a computer-readable recording medium storing the program. In this case, the above mentioned processing may be performed by the computer reading and executing this program. The "computer-readable recording medium" here refers to a magnetic disk, a magneto-optical disk, a CD-ROM, a DVD-ROM, a semiconductor memory or the like. This computer program may be distributed to the computer via a communication line, and the computer receiving this distribution may execute the program.

What is claimed is:

1. A controller that has an error correction function that encodes information data into code words and decodes code words into information data by using error correction codes, and automatically corrects a correctable error in decoding, the controller comprising:

a state monitoring unit that monitors a state of a monitoring target and outputs state information;

a correction rate calculation unit that outputs a correction rate for respective states; and an error correction processing unit that has an error correction code group including a plurality of error correction codes having a correction capability ranking defined based on a predetermined standard, encodes information data into code words and decodes code words into information data by switching the error correction codes, and outputs correction information related to the error correction, wherein the correction rate calculation unit is configured to calculate the correction rate for the respective states based on the state information outputted by the state monitoring unit and the correction information outputted by the error correction processing unit, wherein the error correction processing unit is configured to switch the error correction codes to a higher correction capability based on the comparison of the correction rate for the respective states outputted by the correction rate calculation unit with a first predetermined threshold, and, when the correction rate for the respective states does not exceed the first predetermined threshold, the error correction processing unit is further configured to switch the error correction codes to a lower correction capability based on the comparison of the correction rate for the respective states outputted by the correction rate calculation unit with a second predetermined threshold, and wherein the first predetermined threshold and the second predetermined threshold are changeable according to the states of the monitoring target when the correction rate for the respective states is within the first predetermined threshold and the second predetermined threshold.

2. The controller having an error correction function according to claim 1, further comprising a sequential arithmetic circuit, wherein the correction rate calculation unit is configured to calculate the correction rate for the respective states, using the sequential arithmetic circuit.

3. The controller having an error correction function according to claim 1, wherein the correction rate calculation unit includes a correction information history table that stores the state information and the correction information after linking these items of information, and is configured to calculate the correction rate for the respective states, based on the state information outputted by the state monitoring unit, the correction information outputted by the error correction processing unit, and the correction information history table.

4. The controller having an error correction function according to claim 1, wherein the error correction processing unit is configured so that code words based on one error correction code of the error correction code group can be re-encoded into code words based on another error correction code of the error correction code group.

5. The controller having an error correction function according to claim 1, wherein the error correction code group includes error correction codes having a correction capability quantified based on the number of random error-correctable bits.

6. The controller having an error correction function according to claim 1, wherein
the error correction code group includes error correction codes having a correction capability quantified based on the number of burst error-correctable bits.

7. The controller having an error correction function according to claim 1, wherein
the error correction code group includes error correction codes having a correction capability quantified based on an encoding rate.

8. The controller having an error correction function according to claim 1, wherein
the state monitoring unit includes:
a state information generation unit that monitors a measurement value by a sensor installed in a monitoring target, determines whether the measurement value is within the first predetermined threshold and the second predetermined threshold, and generates state information based on the determined result; and
a range change unit that changes at least one of the first predetermined threshold and the second predetermined threshold.

9. The controller having an error correction function according to claim 1, wherein
the state monitoring unit includes:
a state information generation unit that monitors a program counter of a controller of a machine executing a control program, determines whether a value of the program counter is within a predetermined program block or not, and generates state information based on the determined result; and
a definition change unit that changes the definition of the predetermined program block.

10. The controller having an error correction function according to claim 1, wherein
the controller includes an error correction code registration/change unit that registers or changes an error correction code in the error correction code group.

11. The controller having an error correction function according claim 1, wherein
the correction rate calculation unit is configured to calculate the correction rate for the respective states based on the number of corrected bits in a predetermined period for the respective states.

\* \* \* \* \*